United States Patent [19]
Karnezos

[11] Patent Number: 5,397,921
[45] Date of Patent: Mar. 14, 1995

[54] TAB GRID ARRAY

[75] Inventor: Marcos Karnezos, Menlo Park, Calif.

[73] Assignee: Advanced Semiconductor Assembly Technology, Palo Alto, Calif.

[21] Appl. No.: 116,944

[22] Filed: Sep. 3, 1993

[51] Int. Cl.$^6$ .............. H01L 23/48; H01L 29/44; H01L 29/52; H01L 29/60

[52] U.S. Cl. .................... 257/779; 257/783; 257/786; 257/698

[58] Field of Search .......... 257/779, 783, 784, 786, 257/777, 778, 698; 361/792

[56] References Cited

U.S. PATENT DOCUMENTS

| | | | |
|---|---|---|---|
| 4,842,662 | 6/1989 | Jacobi | 156/633 |
| 5,019,673 | 5/1991 | Juskey et al. | 257/778 |
| 5,045,921 | 9/1991 | Lin et al. | 257/698 |
| 5,045,922 | 9/1991 | Kodama et al. | 257/698 |
| 5,136,366 | 8/1992 | Worp et al. | 357/72 |
| 5,222,014 | 6/1993 | Lin | 361/792 |
| 5,289,346 | 2/1994 | Carey et al. | 257/778 |

*Primary Examiner*—Andrew J. James
*Assistant Examiner*—S. V. Clark
*Attorney, Agent, or Firm*—Skjerven, Morrill MacPherson, Franklin & Friel

[57] ABSTRACT

A TAB Grid Array (TGA) pack package for an integrated circuit. A TGA package provides an efficient structure and method to connect a semiconductor die encapsulated in the TGA package to an external printed circuit board (PCB). The TGA package uses a tape automated bonding (TAB) technique to provide a generally flexible dielectric film bearing a pattern of conductive traces radially emanating from a die aperture to connect to an area array of pads arranged on the tape perimeter. The pads of area array of pads are connected to the TAB traces using conventional TAB inner lead bonding techniques, or alternatively, wire bonding methods, with both the semiconductor die and the TAB traces facing down towards the PCB. In one embodiment, the back of a semiconductor die and the TAB tape are attached to a stiffener via suitable bonding agents. The stiffener provides the mechanical rigidity to the package and efficiently removes the dissipated power. By using an encapsulation material, both the semiconductor die and the bonds between the semiconductor die and the TAB tape are protected from the environment. Solder balls are attached on the area array of pads of the TGA package facing down. These same solder balls in turn are used to electrically and mechanically connect the package to the external PCB.

15 Claims, 14 Drawing Sheets

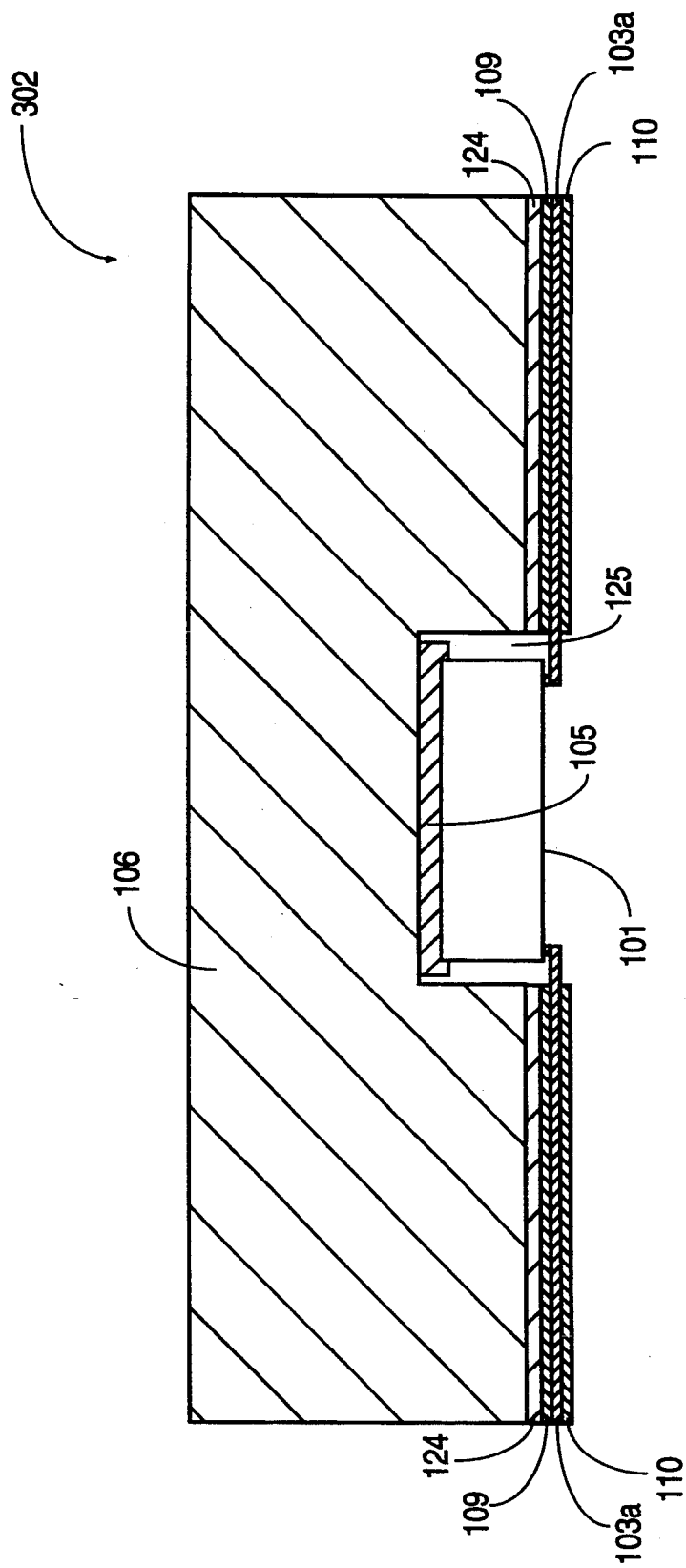
FIG. 3a-2 DIE ATTACH

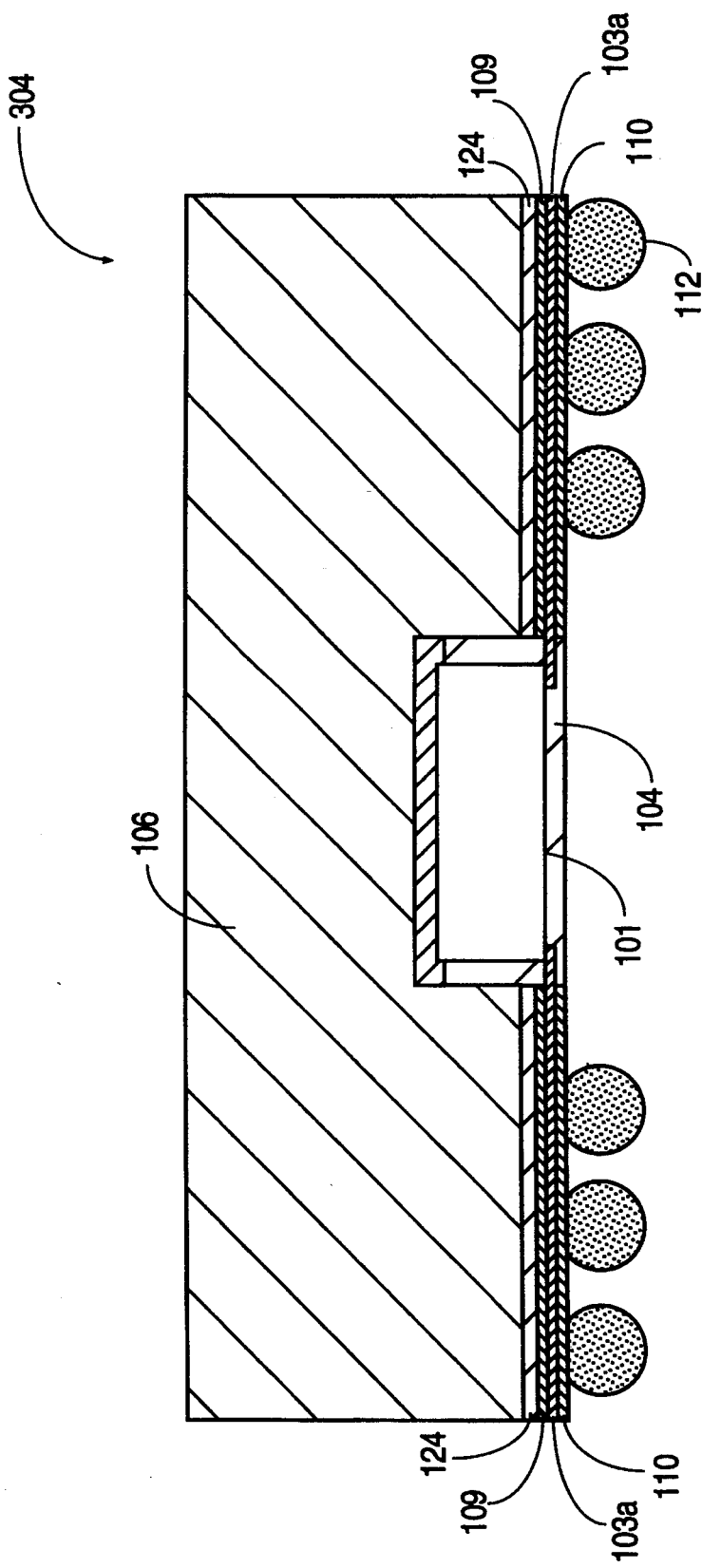
FIG. 3a-4 SOLDER BALL ATTACH

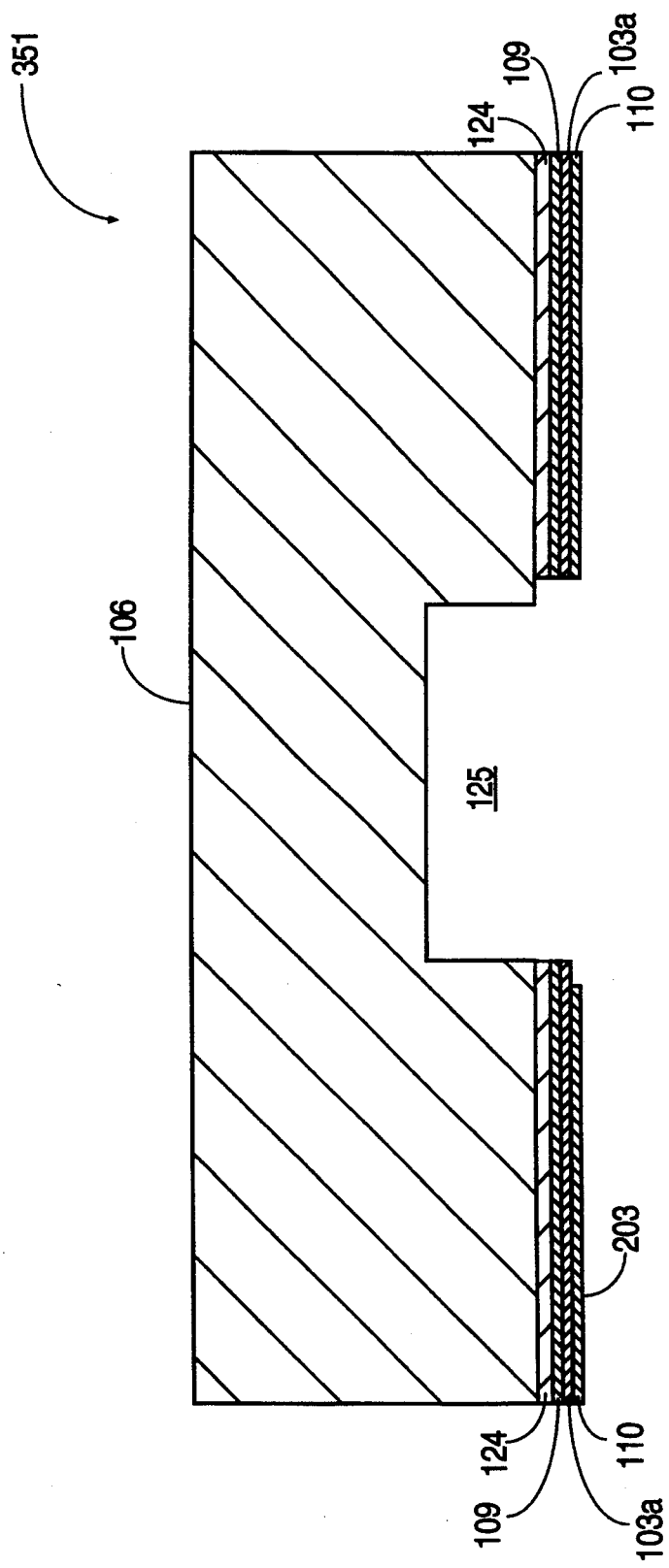
FIG. 3b-1 TAPE ATTACH

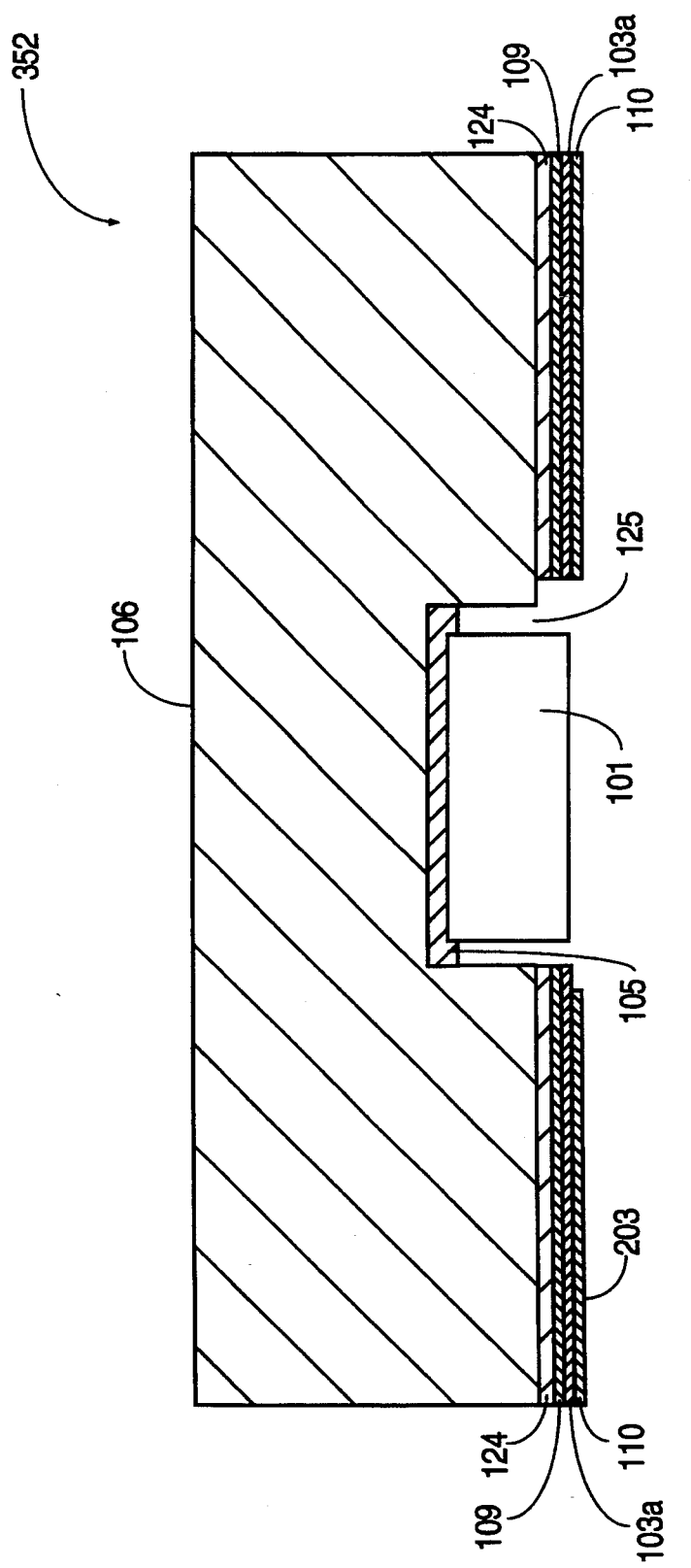
FIG. 3b-2 DIE ATTACH

TAB GRID ARRAY

BACKGROUND OF THE INVENTION

1. Field of the Invention

The present invention relates to package design for integrated circuits (ICs), and in particular relates to methods and apparatuses for providing packages which efficiently connect an integrated circuit die to a printed circuit board (PCB).

2. Description of the Related Art

As ICs include a larger number of circuits, use larger silicon areas, and operate at increasingly higher clock frequencies, surface-mounted packages for ICs are correspondingly required to have increasingly higher lead counts, smaller footprints and higher electrical and thermal performance, while at the same time achieving at least existing accepted reliability standards. Conventional TAB- or lead frame-based packages can deliver satisfactory thermal and electrical performance up to about 300 leads, at 10 watts, and operate up to 50 MHz. However, as the lead count increases above 300 leads, to avoid an increase in the footprint, the lead pitch (i.e. spacing between leads) is required to be less than 0.5 mm. A larger footprint would prevent high density board assembly, which is critical for many products, particularly in portable and consumer oriented products, where function in limited space is an important competitive advantage. Conversely, a fine lead pitch requires expensive placement equipment and a difficult assembly process. In addition, from the product design point of view, to accommodate fine pitch packages, PCBs are required to have more signal layers and more vias. These factors lead to lower yield in the assembly process and higher cost for PCBs.

In response to the demand for IC packages of higher lead count and smaller foot print, Ball Grid Array (BGA) packages are developed. A BGA package eliminates the need for fine pitch and reduces package footprint. A BGA package is a surface-mount package that is assembled to the external or "mother" PCB using an area array of solder balls, instead of fine pitch in-line leads which are easily damaged during the process of installing the IC on an external PCB. An advantage of the BGA package is a small footprint, a large ball grid array pitch and a relatively simple, almost self-aligning, assembly process to the external PCB. For example, a 208 lead, 2 mm thick QFP (Quad Flat Pack) has a typical footprint of 32×32 mm and a 0.5 mm lead pitch. In contrast, a 212-pin BGA package would be 1.5 mm thick and has a footprint of 27×27 mm, using a 1.5 mm ball pitch. At the minimum, a BGA package requires a two-metal layer PCB substrate instead of a lead frame or TAB. Such BGA package is typically a "cavity up" package, which is assembled with the back of the semiconductor die attached to the top surface (i.e. the upward-facing surface) of the substrate. A typical substrate is a PCB. The die is wire-bonded to the substrate traces and overmolded. When assembled to an external PCB, an area array of solder balls is attached to the exposed back-side (i.e. the downward-facing surface of the substrate) metal traces of the substrate routed from the top surface.

An example of a BGA package is described in U.S. Pat. No. 5,136,366, entitled "Overmolded Semiconductor Package With Anchoring Means", issued Aug. 4, 1992 to Motorola, Inc. The main limitations of prior art BGA packages are their low power dissipation, limited electrical performance and susceptibility to moisture.

Power dissipation in a prior art BGA package is limited to 3 watts or less because the heat generated by the semiconductor die is conducted from the back of the IC through the package substrate to the external PCB. Solder balls under the IC can be used to enhance power dissipation. However, to achieve power dissipation through the solder balls, the external PCB is required to have ground planes, which limit signal routing space on the PCB and increase board cost.

Further, the operating frequency—a measure of electrical performance—of a prior art BGA package is much lower than 50 MHz. The low electrical performance is due to the high inductance traces looping from the top surface of the substrate to the edge of the substrate, and then to the back-side for connecting to the solder balls. This looping of traces is dictated by current PCB technology which cannot produce fine enough lines to route traces between ball pads and by the need to electroplate the traces, which is accomplished by connecting the substrate to plating bars on the perimeter of the package.

The moisture susceptibility in a prior art BGA package is higher than a conventional plastic molded package because the PCB substrate of the BGA package absorbs more moisture and cracks the package during the board assembly process. This is because, during a high temperature step (typically greater than 200° C.) in the assembly of the BGA package to an external PCB board, moisture trapped in such package during and after BGA package assembly rapidly expands. Such expansion can cause cracks on the molding, commonly known as "popcorning", thereby causing a package failure. To minimize moisture entering the BGA package prior to assembly to the external PCB board, board assembly is preferably carried out within a few hours after the BGA package is removed from a moisture-proof shipping bag.

The electrical performance and thermal dissipation of a BGA package can be considerably enhanced at a significantly increased cost by a "cavity down" BGA package. A "cavity down" BGA package uses a multi-layer PCB substrate with a cavity which allows for lower electrical parasitic impedances. Such a package extends the electrical performance up to about 100 MHz. The inclusion of a solid metal slug at the bottom of the cavity increases thermal dissipation to 25 watt. The "cavity down" BGA package technology is very similar to the well-established Printed Circuit Pin Grid Array (PCPGA) technology, except that the pins of a PCPGA package are replaced in the BGA package with solder balls. The main drawback of a BGA package is the high cost.

Both "cavity up" and "cavity down" BGA packages use wire bonds to electrically connect the die to the substrate. Wire-bonding limits how fine the pad pitch can be on an IC, which in turn increases the die size of the IC, especially when the die is pad-limited. Pad-limited ICs occur more often as circuit density increases and typical die sizes reach 10×10 mm. A larger die size results in a higher cost, which can be avoided only by reducing the wire bond pitch. Current wire bond pitch seems to have reached its limit at 100 microns.

SUMMARY OF THE INVENTION

In accordance with the present invention, an integrated ciurcuit package is provided, comprising a TAB tape, a stiffener structure, and solder balls for providing external connection to a semiconductor die connected through electrically conductive traces of the TAB tape. In the preferred embodiment, the TAB tape has upper and lower dielectric layers each having an aperture for accommodating the semiconductor die. In addition, the lower dielectric layer is provided an array of openings which is coincident with an array of electrically conductive pads in the TAB tape, so as to allow the solder balls to attach to the conductive pads. The semiconductor die can be connected to the TAB tape either by inner lead bonding, or by wire bonding.

The stiffener of the present invention can also act as a heat spreader. Typically, the stiffener has a cavity for accommodating the semiconductor die. This cavity is aligned with an aperture in the TAB tape for accommodating the semiconductor die. The semiconductor die is attached to the back wall of this cavity using a thermally conductive adhesive. The TAB tape is attached to the surface of the stiffener using a thin film of adhesive, which is preferably similar to the adhesive used to hold together the upper and lower films of dielectric in a TAB tape.

Each of the solder balls approximates the size of the openings in the lower dielectric layer of the TAB tape, so as to allow the solder balls to attach to the electrically conductive pads. In selected positions in the array of electrically conductive pads, openings are provided both in the electrically conductive pads and the first dielectric layer, so that the solder balls at these positions are attached also to the surface of the stiffener, thereby creating a ground connection. Such ground connection provides a ground path of controlled and predictable impedance with lower electrical parasitics, and extends the performance of the package to upwards of 100 MHz.

In accordance with another aspect of the present invention, an assembly process for fabricating an integrated circuit package is provided. In one embodiment, in the first step, electrically conductive traces on a TAB tape are bonded to corresponding conductive pads of a semiconductor die using inner lead bonds. Then, the semiconductor die is attached to the back wall of a cavity in a heat spreader using a thermally conductive adhesive. At the same time, the TAB tape is attached to the heat spreader using a TAB adhesive similar to the adhesive used in holding dielectric layers of the TAB tape together. Both the thermally conductive adhesive and the TAB adhesive are cured before an encapsulation material for encapsulating the semiconductor die and the inner lead bonds is applied. Solder flux is applied on the solder balls, which are then attached to the conductive pads of the TAB tape. The solder balls are fixed in a reflowing step by heat. Thereafter, excess flux from the conductive pads are removed using a cleaning agent and the integrated circuit package is then dry baked.

In accordance with another aspect of the present invention, a second assembly process for fabricating an integrated circuit package is provided. In this process, the semiconductor die and the TAB tape are attached to the stiffener before a wire bonding step connects the conductive pads of the semiconductor die to the conductive traces of the TAB tape. A ground connection is provided to the stiffener by wire bonding the stiffener to a pad on the semiconductor die.

The TAB Grid Array (TGA) package of the present invention solves the problems encountered by the conventional BGA packages. The fine pitch capability of the TAB tape allows a TGA package of the present invention to route all signals to the solder balls on the same side of the tape, thereby resulting in shorter traces and hence lower electrical parasitic impedances.

In the present invention, when TAB inner lead bonding is used instead of wire bonding, the pad pitch can be reduced to 50 microns thereby allowing for significant die size reduction and lower cost. By directly attaching the semiconductor die onto the heat spreader, the thermal performance is significantly increased beyond 25 watts/device.

The susceptibility to moisture in a TGA package is much less than a prior art package using a PCB substrate because the TAB moisture absorption is comparatively low. The TGA package also has a thinner profile when compared to a prior art BGA package because the TAB tape is thinner than the PCB substrate of a BGA package. Overall, the TGA package of the present invention is more reliable because, as compared to prior art BGA packages, fewer connections are used to connect the signal from the IC to the board.

The present invention includes methods and apparatuses for making connections from a die to an external PCB. A TAB Grid Array package is a high performance, high reliability area array package that overcomes the drawbacks of conventional TAB and BGA packages.

An appreciation of the claims and the objectives of the different embodiments of this invention may be achieved by studying the following detailed description of the preferred embodiments and referring to the accompanying drawings.

BRIEF DESCRIPTION OF THE DRAWINGS

FIG. 1b is a partial cut-out view of TAB tape 103 of FIG. 1a.

FIG. 1c is a partial cut-out view of the TGA package in FIG. 1a.

FIG. 3a summarizes the steps in an assembly process for TGA package 100 shown in FIG. 1a.

FIG. 3b summarizes the steps in an assembly process for TGA package 200 shown in FIG. 2a.

DETAILED DESCRIPTION OF THE PREFERRED EMBODIMENTS

Figure 1A:
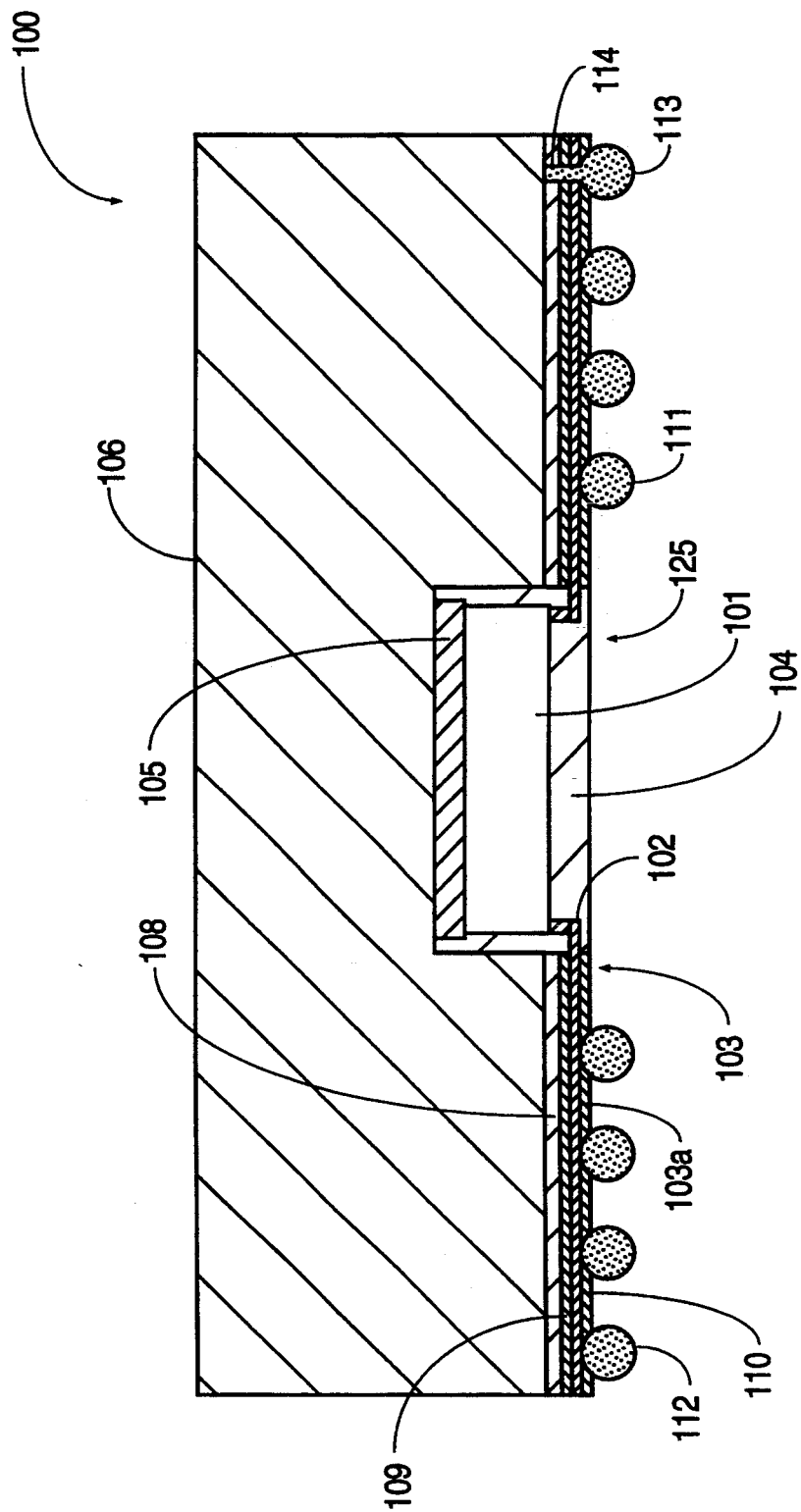
FIG. 1a is a cross-sectional view of a TAB Grid Array (TGA) package 100 using TAB inner lead bonding, in an embodiment of the present invention.

FIG. 1a shows a cross-sectional view of a TAB Grid Array (TGA) package 100 in an embodiment of the present invention. As shown in FIG. 1a, a semiconductor die 101, having contacts 102 closely spaced at a pitch of 50 microns or wider, is encapsulated in a cavity 125 of a metallic heat spreader 106. Cavity 125 is filled with an encapsulation material 104, which can be provided by an epoxy resin, as is known in the art. Semiconductor die 101 is attached by a thin layer of thermally conductive epoxy 105 to heat spreader 106. Contacts 102 are conductively bonded, using an inner lead bonding technique, to a TAB tape 103, which comprises a signal trace and pad ("conductor") layer 103a held between two dielectric layers 109 and 110. Dielectric layer 109 is attached to heat spreader 106 by a thin layer of adhesive 108. Heat spreader 106 also provides support for TAB tape 103, thereby serving as a stiffener material for TAB tape 103. TGA package 100 uses solder balls (e.g. solder balls 111 and 112) to electrically connect the integrated circuit to metallic traces on an external printed circuit board (PCB) 150 (not shown). Openings in dielectric layer 110 allow electrical connections between the metallic traces on layer 103a of TAB tape 103 and metallic traces on external PCB 150. For example, solder ball 112 is used to make a connection between external PCB 150 and conductive pads in TAB tape 103 through an opening in dielectric layer 110. An another example is an opening 114, which opens through both dielectric layers 109 and 110 to provide a ground connection between external PCB 150 and heat spreader 106 via solder ball 113.

Figure 1B:
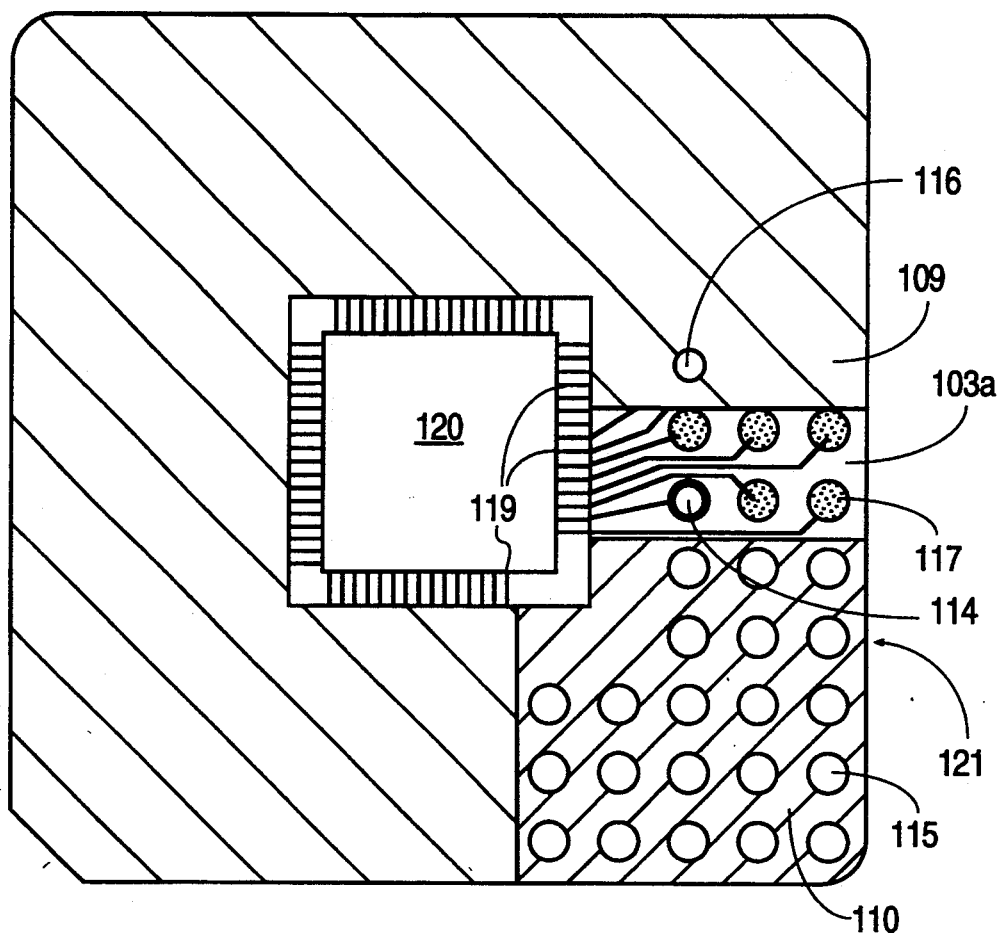

A partial cut-out view of TAB tape 103 is shown in FIG. 1b. In this embodiment, TAB tape 103 includes a 30-micron thick conductor layer 103a and, two 50-micron dielectric layers 109 and 110 on each side of conductor layer 103a. The partial cut-out view of FIG. 1b is a top view of TAB tape 103 with a corner of dielectric layer 109 removed, for the purpose of this illustration, to expose the conductor layer 103a. Conductor layer 103a has a multitude of electrically conductive traces 119 that emanate radially from the center device hole area 120 to connect to an array 121 of conductive pads. In this embodiment, the pitch of pad array 121 can range between 600–1500 microns and the diameter of each pad can range between 100–750 microns, depending on the pin count required by the semiconductor die. Most of the pads in pad array 121 are solid, e.g. pad 117, and are used for signal connections. Other pads, e.g. 114, have an aperture at the center and are used for ground connections.

Figures 1, 3A:
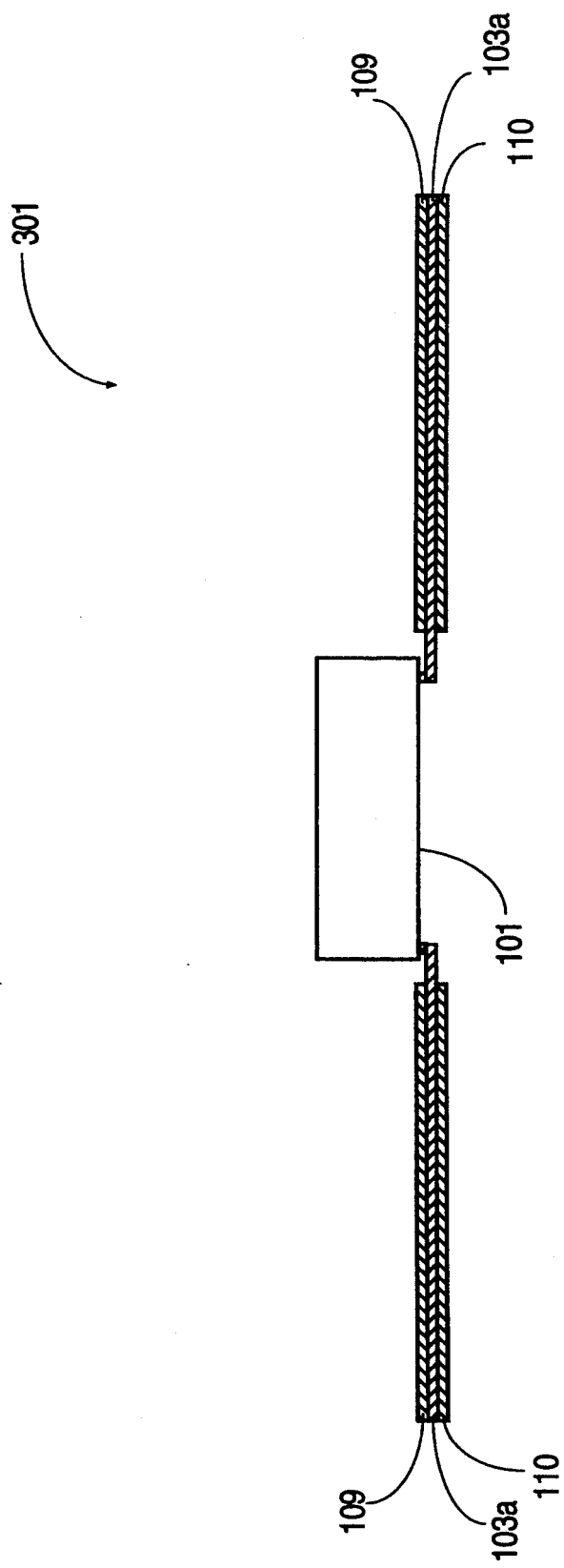
Figures 3, 3A:
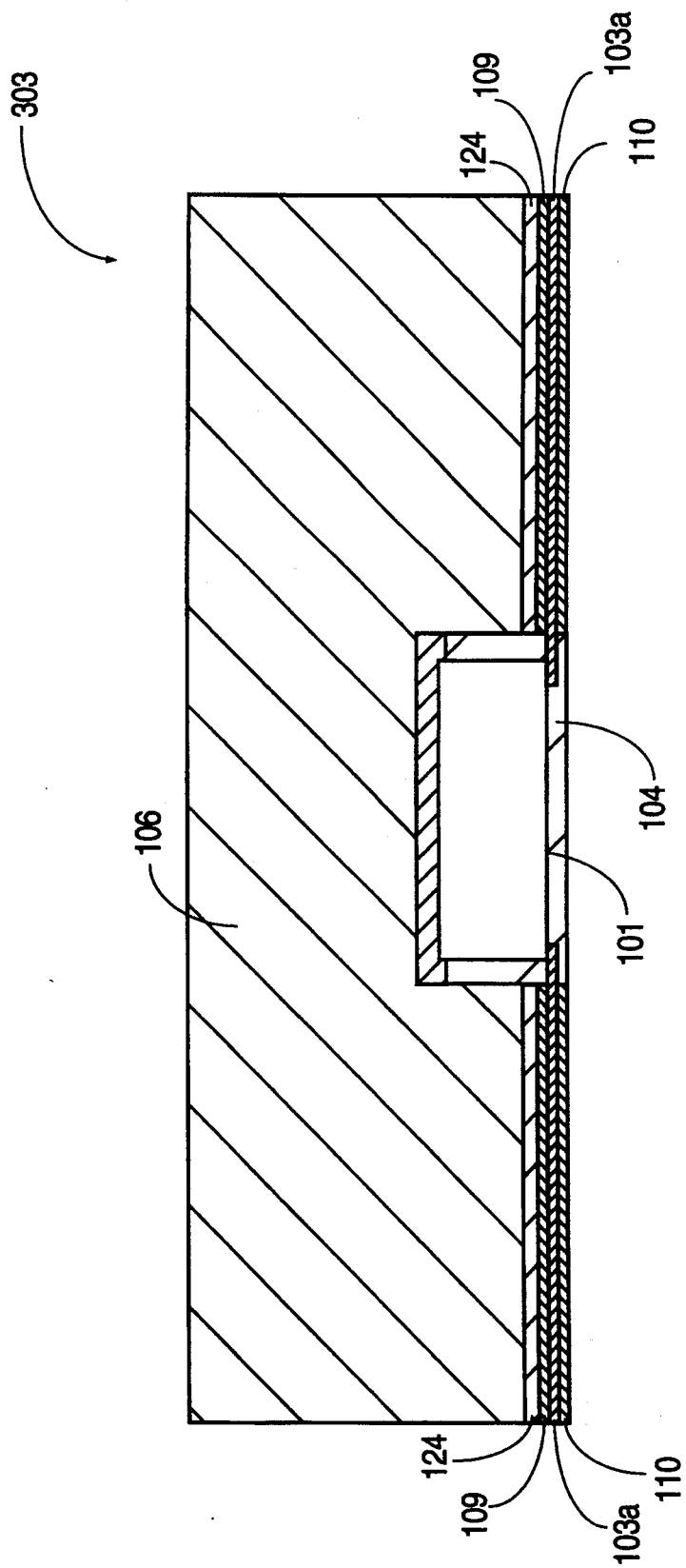

A process for assembling TGA package 100 is described with the aid of FIG. 3a. In step 301, the pads on the die are bonded to the free-standing tape traces, i.e. traces 119, via the conventional thermosonic or thermocompression TAB inner lead bonding techniques. Such techniques are known in the industry, including the method disclosed in U.S. Pat. No. 4,842,662 to Jacobi, entitled "Bumpless Inner Lead Bonding", issued in Jun. 27, 1989, using bumpless thermosonic bonding on both the semiconductor die and the TAB tape. Dielectric layer 109, which carries the conductive traces 119, is solid except at the locations of the ground pads in pad array 121. At a ground pad, dielectric layer 109 provides an aperture of the same size as the ground pad. One example of such an aperture is aperture 116 of FIG. 1b. Dielectric layer 110 has an array of apertures coincident with the pads in pad array 121 of conductor layer 103a. Dielectric layers 109 and 110 each have an inner aperture, shown in FIG. 1a at center device hole area 120. The inner aperture accepts the semiconductor die, but leaves a short length of the inner leads or traces 119 unsupported for bonding.

Figure 1C:
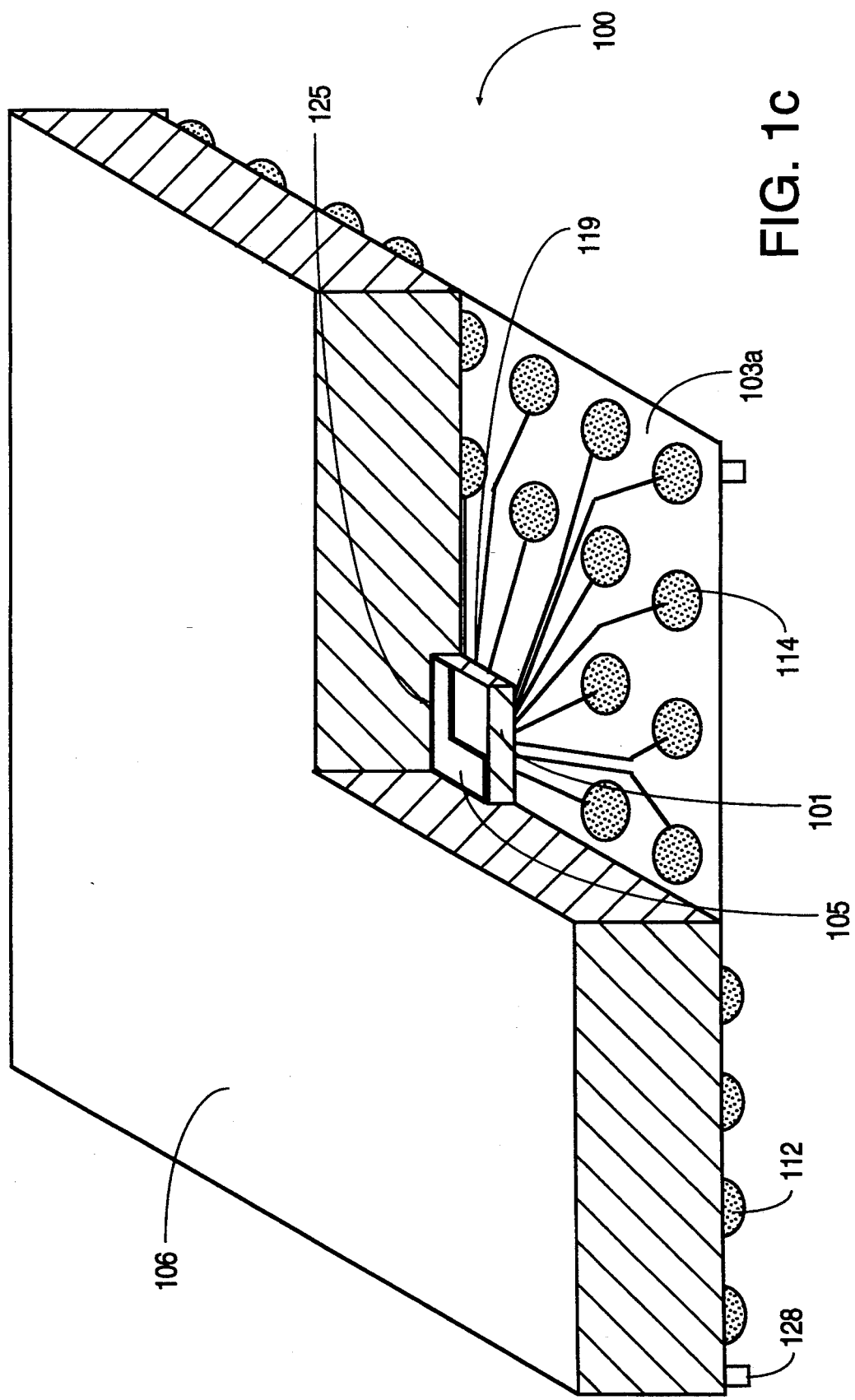

FIG. 1c shows a partial cut-out view of FIG. 1a's TGA package 100. This partial cut-out view exposes, for the purpose of illustration, cavity 125 of heat spreader 106. Heat spreader 106 is made of a thermally conductive material, such as copper, to remove the power dissipated in the semiconductor die. Other suitable materials can also be used for heat spreader 106. Such other materials include copper/tungsten/copper and copper/molybdenum/copper laminates, beryllium oxide or metallized aluminum nitride. Aluminum nitride can be metallized with chromium/gold, titanium/gold/nickel/gold films. Each of these materials has a high thermal conductivity and a thermal coefficient of expansion (TCE) matching that of silicon. By closely matching the TCE of heat spreader 106 to silicon, incidents of stress-induced die cracking, which are prevalent in large dies (i.e. dies larger than 10 mm by 10 mm), are minimized. For a smaller semiconductor die, heat spreader 106 can be made of materials (e.g. aluminum) of larger TCE mismatch to silicon. As shown in FIGS. 1a and 1c, heat spreader 106 has a cavity 125 which encloses semiconductor die 101. In this embodiment, the downward-facing surface (i.e. the side open to cavity 125) of heat spreader 106 is plated with a coat of thin metal, e.g. silver or gold, that can be wetted by solder. This thin metal coat allows the ground solder balls to mechanically and electrically attach to heat spreader 106 after a reflow step.

In step 302 (FIG. 3a), the back surface of semiconductor die 101 is attached to the back wall of cavity 125 via a thermally conductive adhesive film 105. This thermally conductive adhesive film 105 allows heat to be transferred by conduction from semiconductor die 101 to heat spreader 106. TAB tape 103 is attached to the bottom surface of heat spreader 106 using an appropriate adhesive 124 that can withstand the conventional environmental stress tests usually performed on electronic packages. Usually, such an adhesive is similar to that used in bonding conductor layer 103a and dielectric layers 109 and 110 of TAB tape 103 itself. Die aperture 120 on TAB tape 103 is aligned to cavity 125 with dielectric layer 109 secured on the bottom surface of heat spreader 106. In this embodiment, the process steps for attaching semiconductor die 101 and for attaching TAB tape 103 to heat spreader 106 are performed simultaneously at step 302 and cured simultaneously. Four optional posts, e.g. post 128 of FIG. 1c, are provided at the corners of heat spreader 106 to maintain a certain height of solder balls after a reflow step (see below).

The inner lead bonds, the front side of semiconductor die 101, and the remaining space in heat spreader cavity 125, are filled with encapsulation material 104 at step 303. Encapsulation material 104 is typically syringe-dispensed to enclose semiconductor die 101. The openings between inner leads allow the encapsulant to flow and fill die cavity 125 completely leaving no voids. Hence, encapsulation material 104 protects both the inner lead bonds and semiconductor die 101 from mechanical and environmental damages. In the present embodiment, the encapsulation material is cured at 150° C. for three hours, during which the temperature is ramped three steps.

In this embodiment, at step 304, solder balls are attached onto the pads of pad array 121, which are exposed by the openings of dielectric layer 110. To attach solder balls onto TGA package 100, a flux is first deposited on each solder ball. Next, the solder balls are placed using an appropriate pick-and-place equipment. Subsequently, the solder balls so placed are reflowed in place using a conventional infrared or hot air reflow equipment and process, heating the solder balls to above 200° C. The excess flux is then removed by cleaning TGA package 100 with an appropriate cleaning agent, e.g. a water-based cleaning agent. Under this process, the solder balls placed on the pads of pad array 121 with apertures in dielectric layer 109 are reflowed on heat spreader 106, thereby directly establishing a ground connection between the solder ball and heat spreader 106. On the other hand, the solder balls placed on the solid pads of pad array 121 are connected to the device pads only and provide signal and power connections between the solder balls and traces 119 of the TAB tape. The inner lead bonds provide connection to the corresponding pads of the semiconductor die 101. TGA package 100 is then dry baked at 120° C. for at least one hour.

TGA package 100 can then be assembled to an external PCB using a suitable conventional surface mount process and equipment. An example of such conventional surface mount process dispenses solder paste on connection pads of the PCB, aligns the solder balls on TGA package 100 to these connection pads of the PCB, and reflows the solder balls to establish the desired mechanical and electrical bonds with the PCB.

There are numerous advantages of the present embodiment over conventional BGA packages. For example, the present embodiment uses a single-metal TAB tape 103, which is capable of delivering frequency performance of 100 MHz or more. Further, single-metal tape 103 and electrically conductive heat spreader 106 form a controlled impedance electrical path for signals and minimize uncompensated trace inductance. Such performance is usually only achievable in a relatively higher cost two-metal tape. Because TAB tape 103 can connect to semiconductor die 101 and the external PCB is done on the same side of TAB tape 103, shorter traces result. Further, trace looping from the back side of substrate to the front, as required in a conventional BGA package, is also avoided. The combined result of same-side connection and short traces translate to a much smaller inductance than that of a conventional BGA package.

Using TAB inner lead bonding, the present embodiment achieves a smaller pitch than that achieved by wire bonding, thereby allowing a smaller die to be designed for a pad-limited IC. A smaller die size means lower cost of production. Further, in the TGA package of the present invention, an electrical connection between the semiconductor die and the external PCB board is achieved using only two connections rather than four connections required of a conventional BGA package. A smaller number of connections increases assembly yield and package reliability. Moreover, the TAB tape of a TGA package absorbs significantly less moisture than a conventional BGA package, leading to a higher reliability package not susceptible to the "popcorn" failure mode common in the PCB based BGA packages.

The thermal dissipation capacity of a TGA package of the present invention is significantly greater than a BGA package. Such a TGA package can handle a semiconductor die dissipating power up to 10 watts without using a heat sink. When a heat sink is used with the TGA package of the present invention, power in excess of 25 watts can be handled under forced air conditions. This thermal dissipation capacity represents a junction-to-case thermal impedance of less than 0.4° C./watt, which is achieved because the semiconductor die is directly attached to the heat spreader using a thermally conductive epoxy.

Figure 2A:
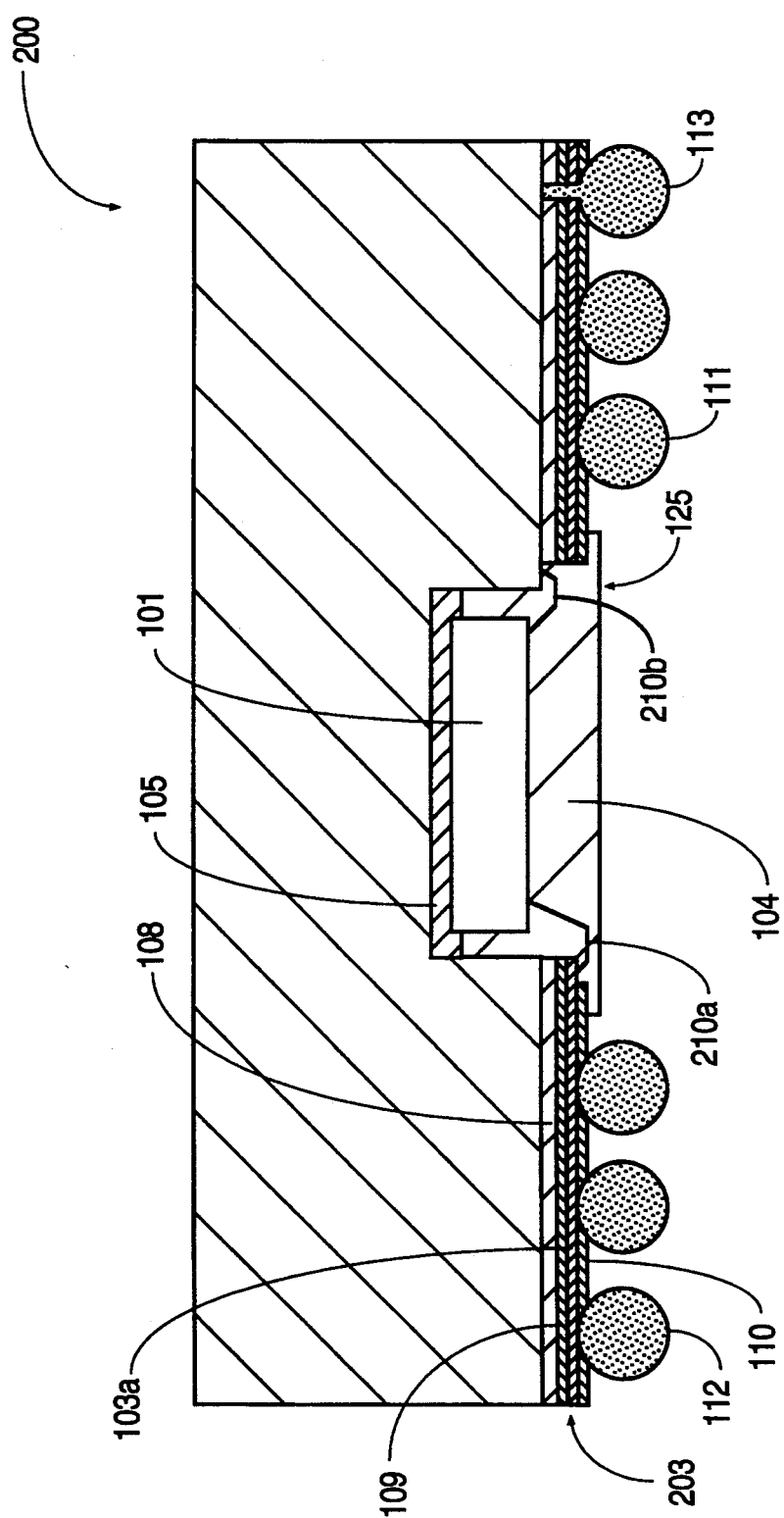
FIG. 2a is a cross-sectional view of a TGA package 200 using wire bonding in a second embodiment of the present invention.
Figure 2B:
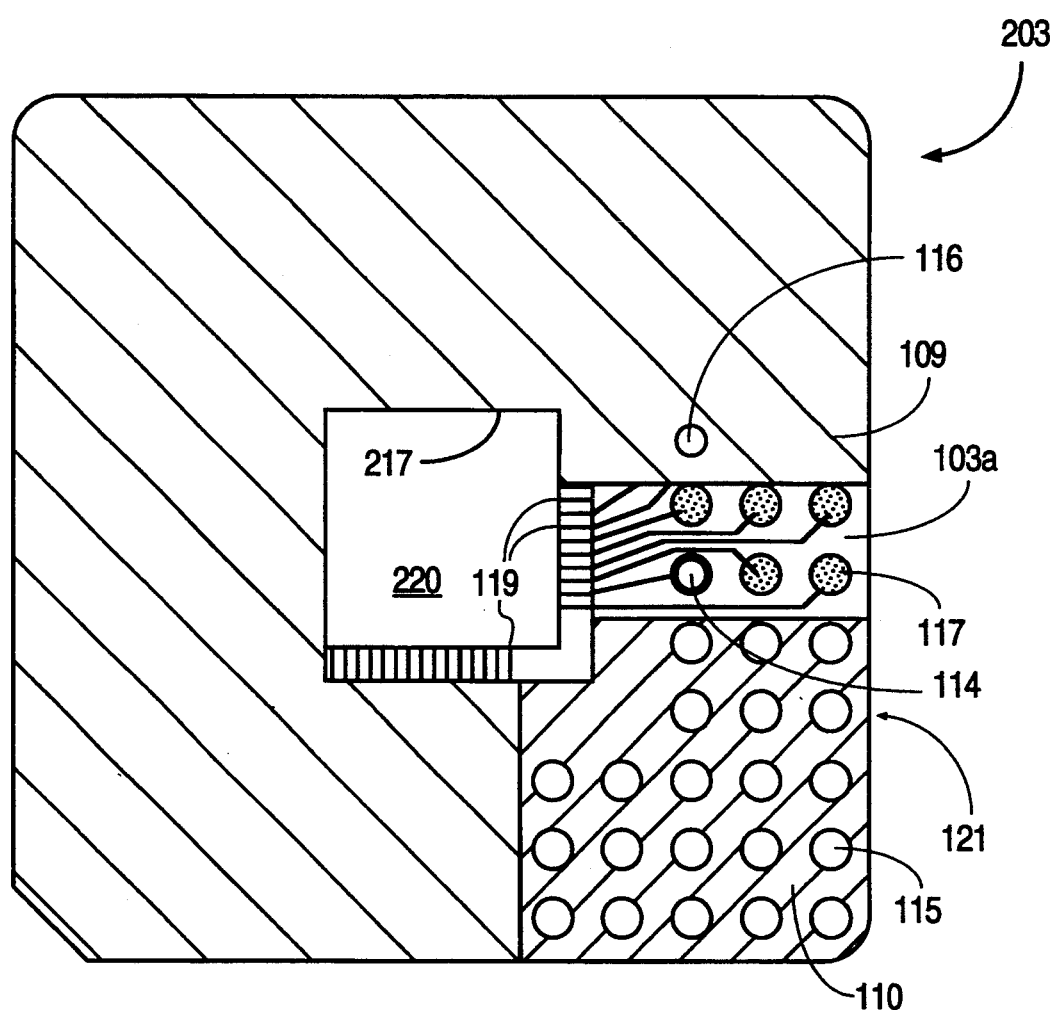
FIG. 2b is a schematic view of the TAB tape 203 of FIG. 2a, which does not use the free-standing inner leads of TGA package 100.

A TGA package 200 in an alternative embodiment is shown in FIGS. 2a and 2b. FIG. 2a is a cross sectional view of TGA package 200, and FIG. 2b is a partially cut-out top view of TAB tape 203 in TGA package 200. TGA package 200 is substantially the same as TGA package 100 of FIG. 1 except for the differences described below. To facilitate cross reference between TGA packages 100 and 200, the same reference numerals are used to indicate substantially identical features.

In TGA package 200, the pads on pad array 121 are connected to traces on a TAB tape 203 using a wire bonding technique, rather than a TAB inner lead bonding technique. Wire bonds 210a and 210b in FIG. 2a are illustrative. In this second embodiment, TAB tape aperture 220 (FIG. 2b) for semiconductor die 101 is slightly larger than die cavity 125 in heat spreader 106, thereby exposing a narrow perimeter of heat spreader 106 surrounding cavity 125. Instead of inner lead bonding, wire bonding is used to provide ground connections directly from semiconductor die 101 to heat spreader 106 by a wire bond 210b to the rim of heat spreader 106 surrounding cavity 125.

As shown in FIG. 2b, the inner leads of traces 119 are completely supported by dielectric layer 109. Unlike in TAB tape 103 of TGA package 100, where the inner leads at the periphery of die aperture 120 are not protected by dielectric layer 109, dielectric layer 109 of TGA package 200 protects traces 119 right up to die aperture 220, hence providing the mechanical support to metal trace 119, so as to establish necessary support for wire bonding.

Figures 3, 3B:
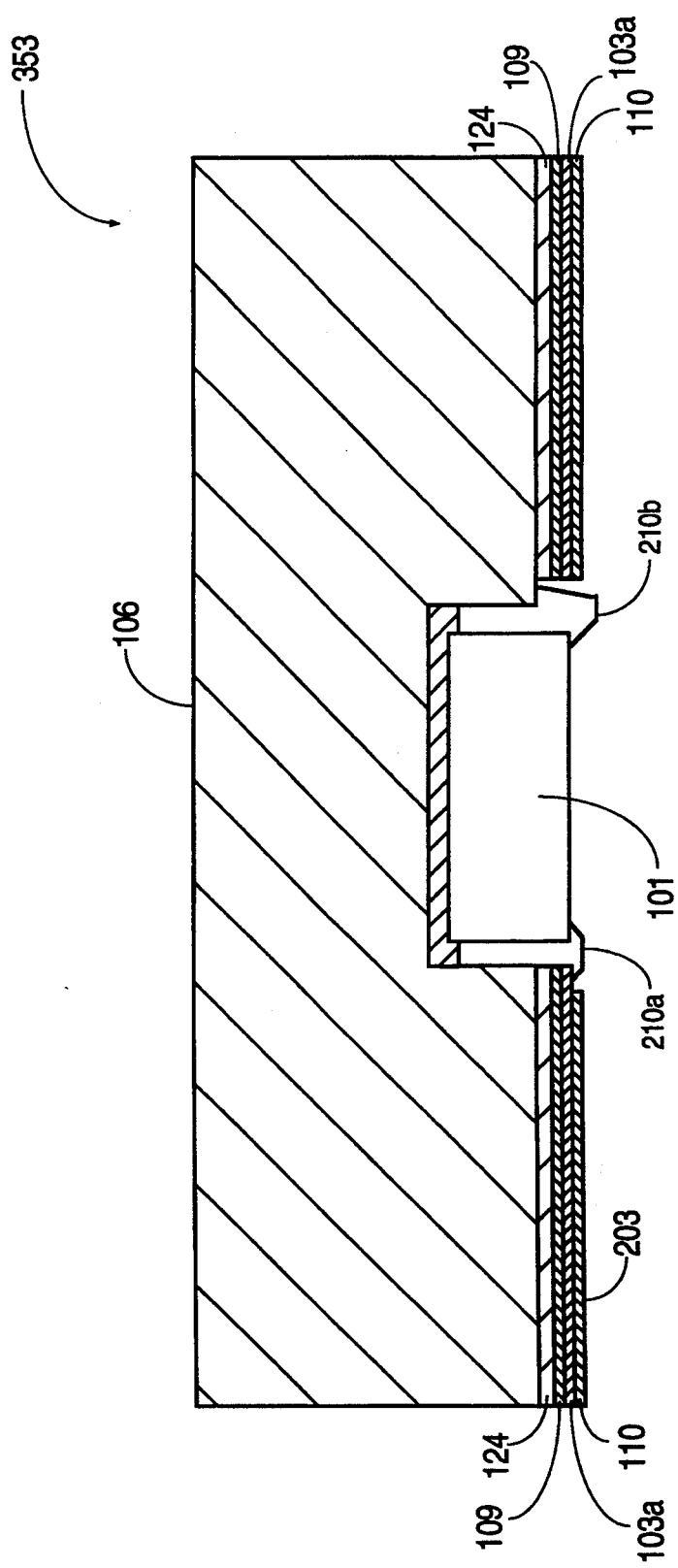
Figures 3, 3B, 4:
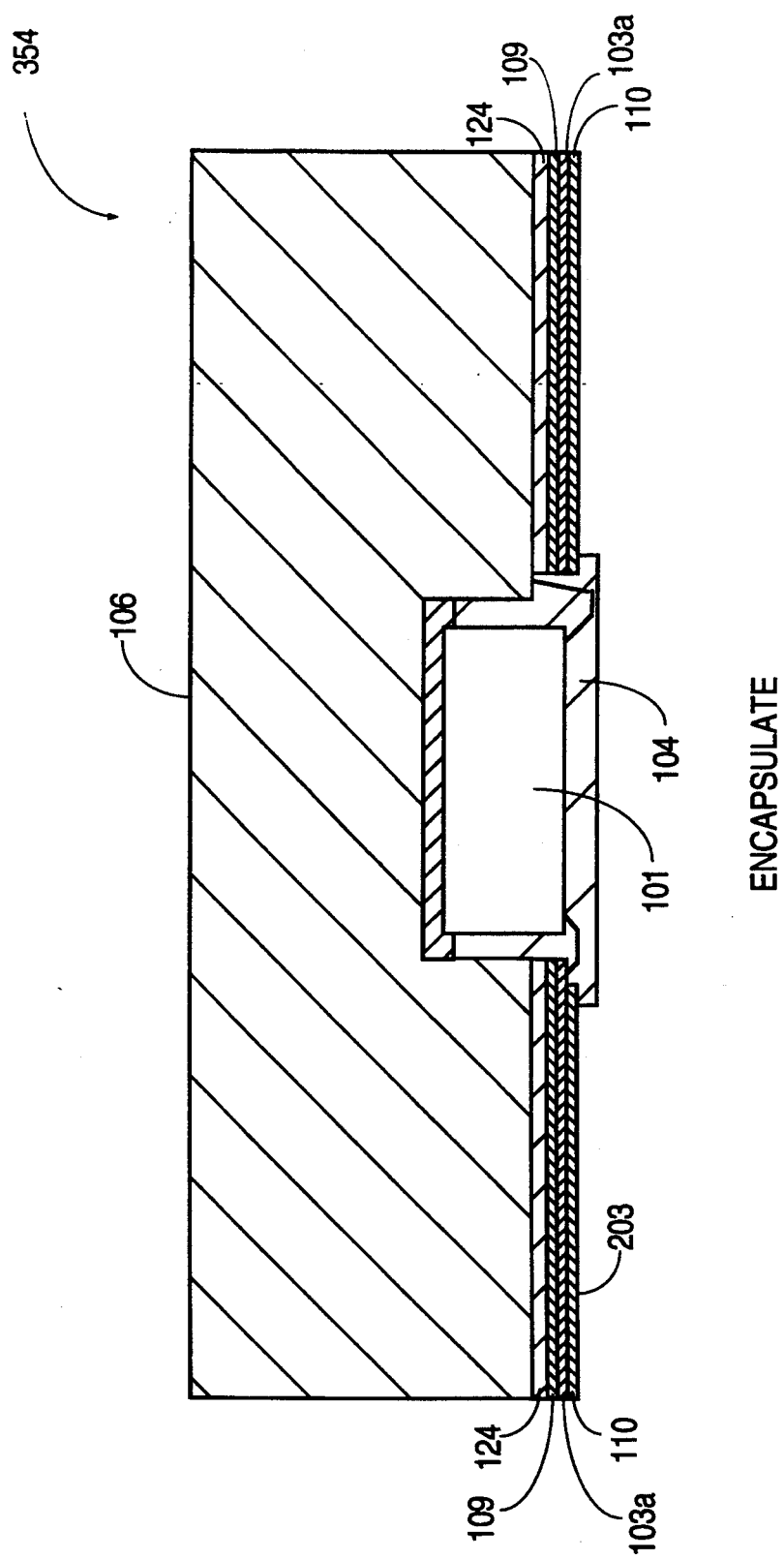
Figures 3, 3B, 4, 5:
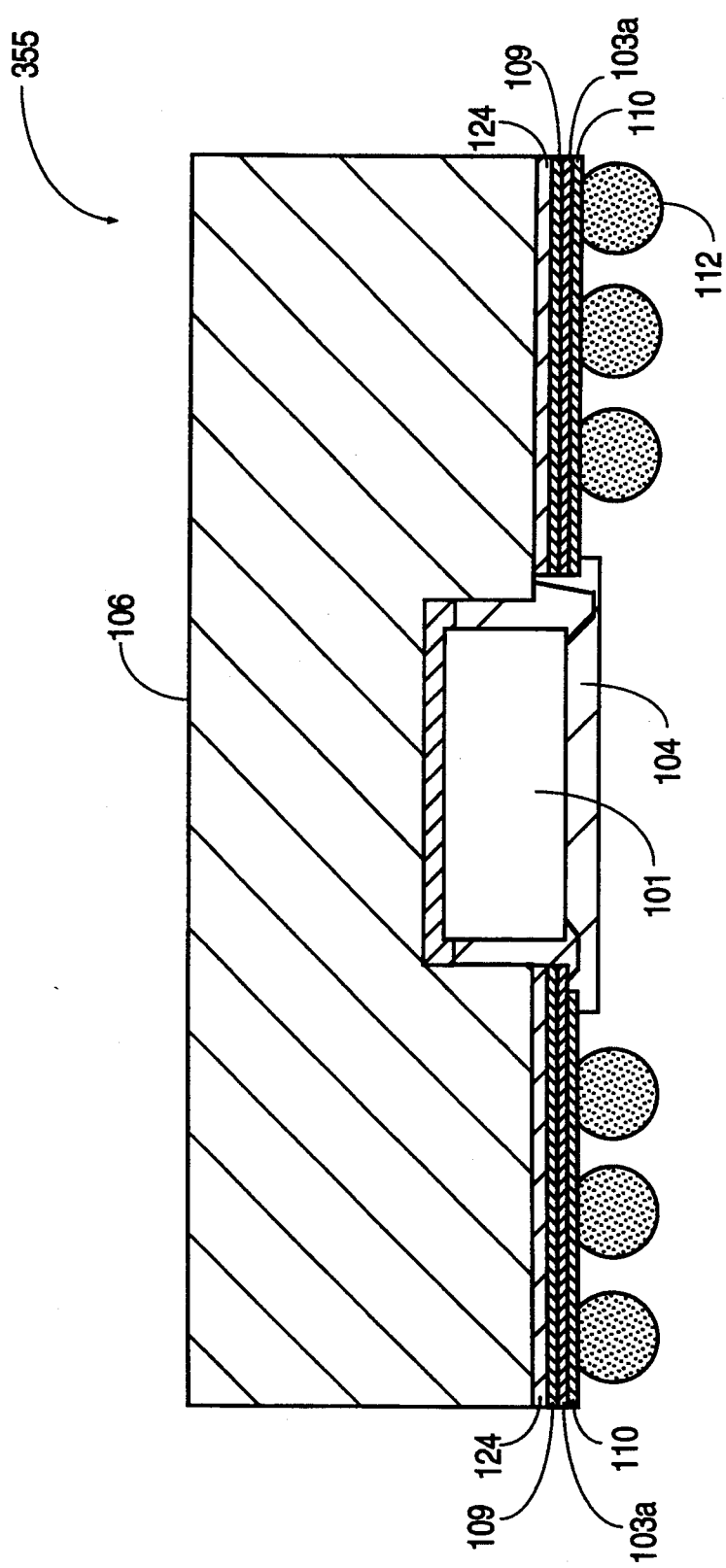

FIG. 3b shows an assembly process for TGA package 200. As shown in FIG. 3b, at step 351, TAB tape 203 is attached to heat spreader 106 using an adhesive film 124, which is described above with respect to the assembly process of FIG. 3a. At step 352, after adhesive film 124 is cured, semiconductor die 101 is attached in cavity 125 using a thermally conductive epoxy 105, which is also described above.

At step 353, after conductive epoxy 105 is cured, pads on semiconductor die 101 are wire bonded to traces 119 on TAB tape 203. At this step also, a ground pad on semiconductor die 101 is wire bonded to heat spreader 106 at the periphery of die aperture 220 of TAB tape 203. This wire bond is shown in FIG. 2b as wire bond 210b. At step 354, an encapsulation material is syringe-dispensed to form encapsulation 104 filling cavity 125 and covering both semiconductor die 101 and the wire bonds. Encapsulation 104 of TGA package 200 is allowed to cure in the same way as the corresponding encapsulation in TGA package 100. Solder balls are attached at step 355. Step 355 is substantially identical as step 304 shown in FIG. 3a in the assembly process of TGA package 100.

The main performance difference between TGA packages 100 and 200 stems from the wire bondings in TGA package 200. Wire bondings in TGA package 200 cannot achieve the fine pitch achieved in TAB inner lead bonding of TGA package 100. Consequently, a pad-limited semiconductor die designed for wire bonding is likely to be larger and more expensive to produce. Also, since the uncompensated impedance of a wire bond is larger than a corresponding TAB inner lead bond, the high-end frequency performance of TGA package 200 is lower than the corresponding frequency performance of TGA package 100.

The detailed description above is provided to illustrate the specific embodiments of the present invention and is not intended to be limiting of the present invention. Numerous modification and variations within the scope of the present invention are possible. The present invention is defined by the following claims.

What is claimed is:

1. A package for a semiconductor die, comprising:
(a) a TAB tape comprising:
first and second dielectric layers having first and second apertures, respectively, aligned to accommodate said semiconductor die, said second dielectric layer having an array of openings, said first dielectric layer having an opening aligned to a selected one of said array of said openings of said second dielectric layer; and
a conductive layer between said first and second dielectric layers, said conductive layer having a third aperture aligned with said first and second apertures to accommodate said semiconductor die, said conductive layer including electrically conductive traces emanating from said third aperture to an array of electrically conductive pads, said array of electrically conductive pads being aligned with said array of openings of said second dielectric layer, wherein a selected electrically conductive pad in said array of electrically conductive pads has an opening which aligns with said opening in said first dielectric layer;
(b) a stiffener having a cavity for accommodating said semiconductor die, said cavity being aligned with each of said first, second and third apertures, said stiffener having an electrically conductive surface, such that a solder ball forms an electrically conductive path to said stiffener through said opening in said first dielectric layer, said opening in said selected electrically conductive pad in said conductive layer, and said selected opening in said second dielectric layer;
(c) an adhesive layer for attaching said TAB tape to said stiffener, said first adhesive layer attaching a surface of said first dielectric layer to said stiffener; and
(d) a plurality of solder balls each approximating the size of said openings of said second dielectric layer, said solder balls being attached to said electrically conductive pads through said openings of said second dielectric layer.

2. A package for a semiconductor die, comprising:
(a) a TAB tape comprising:
first and second dielectric layers having first and second apertures, respectively, aligned to accommodate said semiconductor die, said second dielectric layer having an array of openings; and
a conductive layer between said first and second dielectric layers, said conductive layer having a third aperture aligned with said first and second apertures to accommodate said semiconductor die, said conductive layer including electrically conductive traces emanating from said third aperture to an array of electrically conductive pads, said array of electrically conductive pads being aligned with said array of openings of said second dielectric layer;
(b) a stiffener having a cavity for accommodating said semiconductor die, said cavity being aligned with first, second and third apertures;
(c) an adhesive layer for attaching said TAB tape to said stiffener, said first adhesive layer attaching a surface of said first dielectric layer to said stiffener; and
(d) a plurality of solder balls each approximating the size of said openings of said second dielectric layer, said solder balls being attached to said electrically conductive pads through said openings of said dielectric layer;
wherein (i) said electrically conductive traces have free standing ends protruding into said cavity, (ii) said semiconductor die has a plurality of connection pads, said connection pads being connected to said free standing ends of said electrically conductive traces of said conductive layer using TAB inner lead bonding connections, and (iii) said structure further comprises an encapsulation material filling said cavity of said stiffener and enclosing said semiconductor die and said TAB inner bonding connections.

3. A package for a semiconductor die, comprising:
(a) a TAB tape comprising:
first and second dielectric layers having first and second apertures, respectively, aligned to accommodate said semiconductor die, said second dielectric layer having an array of openings; and
a conductive layer between said first and second dielectric layers, said conductive layer having a third aperture aligned with said first and second apertures to accommodate said semiconductor die, said conductive layer including electrically conductive traces emanating from said third aperture to an array of electrically conductive pads, said array of electrically conductive pads being aligned with said array of openings of said second dielectric layer;
(b) a stiffener having a cavity for accommodating said semiconductor die, said cavity being aligned with first, second and third apertures;
(c) an adhesive layer for attaching said TAB tape to said stiffener, said first adhesive layer attaching a surface of said first dielectric layer to said stiffener; and
(d) a plurality of solder balls each approximating the size of said openings of said second dielectric layer, said solder balls being attached to said electrically conductive pads through said openings of said dielectric layer;
wherein (i) said semiconductor die has a plurality of connection pads, said connection pads being connected to said electrically conductive traces of said conductive layer using wire bonding connections, and (ii) said structure further comprises an encapsulation material filling said cavity of said stiffener and enclosing said semiconductor die and said wire bonding connections.

4. A structure as in claim 1, further comprising a second adhesive layer for attaching said semiconductor die to said stiffener.

5. A structure as in claim 4, wherein said stiffener comprises a thermally conductive material and said second adhesive layer comprises a thermally conductive epoxy.

6. A structure as in claim 1, wherein said stiffener comprises a material having a thermal expansion coefficient approximating the thermal expansion coefficient of silicon.

7. A structure as in claim 1, wherein said stiffener comprises a material selected from the group consisting of (i) copper, (ii) copper/molybdenum/copper laminate, (iii) copper/tungsten/copper laminate (iv) beryllium oxide, and (v) metallized aluminum nitride.

8. A structure as in claim 7, wherein said metallized aluminum nitride includes a film selected from the group of nickel/gold, chromium/gold and titanium/gold.

9. A structure as in claim 1, wherein said stiffener has a conductive surface plated with a metal which is wettable by solder.

10. A structure as in claim 9, wherein said metal is selected from the group consisting of silver and gold.

11. A structure as in claim 1, wherein the thicknesses of said adhesive layer and said first dielectric layer are selected to allow said electrically conductive traces and said stiffener to form a controlled impedance electrical path.

12. A structure as in claim 1, wherein said size of said openings in said second dielectric layer is selected to maintain a predetermined diameter of a solder ball after a reflow step.

13. A structure as in claim 1, wherein said apertures for accommodating said semiconductor die are slightly larger than the opening of said cavity in said stiffener, so as to allow a wire bond to provide a ground connection between said semiconductor die and said stiffener.

14. A structure as in claim 1, wherein said first dielectric layer has inner and outer edges completely supporting said electrically conductive traces.

15. A structure as in claim 1, wherein said second dielectric layer has inner edges that expose a short length of each of said electrically conductive traces.

* * * * *